(12) United States Patent
Pillarisetty et al.

(10) Patent No.: US 7,825,437 B2
(45) Date of Patent: Nov. 2, 2010

(54) UNITY BETA RATIO TRI-GATE TRANSISTOR STATIC RANDOM ACCESS MEMORY (SRAM)

(75) Inventors: Ravi Pillarisetty, Portland, OR (US);
Suman Datta, Port Matilda, PA (US);
Jack Kavalieros, Portland, OR (US);
Brian S. Doyle, Portland, OR (US);
Uday Shah, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 438 days.

(21) Appl. No.: 12/006,082

(22) Filed: Dec. 28, 2007

(65) Prior Publication Data
US 2009/0166680 A1 Jul. 2, 2009

(51) Int. Cl.
*H01L 27/118* (2006.01)
(52) U.S. Cl. .............................. 257/204; 257/E21.014; 438/157

(58) Field of Classification Search ................. 257/204, 257/E21.014; 438/157
See application file for complete search history.

(56) References Cited

U.S. PATENT DOCUMENTS

| 2008/0128796 A1* | 6/2008 | Zhu et al. | 257/328 |
| 2009/0001464 A1* | 1/2009 | Booth et al. | 257/347 |
| 2009/0078997 A1* | 3/2009 | Greene et al. | 257/347 |

* cited by examiner

*Primary Examiner*—Thao X Le
*Assistant Examiner*—Matthew Gordon
(74) *Attorney, Agent, or Firm*—Ryder, Lu, Mazzeo, and Konieczny, LLC; Douglas J. Ryder

(57) ABSTRACT

In general, in one aspect, a method includes forming N-diffusion and P-diffusion fins in a semiconductor substrate. A P-diffusion gate layer is formed over the semiconductor substrate and removed from the N-diffusion fins. A pass-gate N-diffusion gate layer is formed over the semiconductor substrate and removed from the P-diffusion fins and pull-down N-diffusion fins. A pull-down N-diffusion layer is formed over the semiconductor substrate.

17 Claims, 3 Drawing Sheets

US 7,825,437 B2

UNITY BETA RATIO TRI-GATE TRANSISTOR STATIC RANDOM ACCESS MEMORY (SRAM)

BACKGROUND

Six transistor static random access memory (6T SRAM) cells require sufficient static noise margin (SNM) to maintain cell stability during read operations. The SNM is proportional to the beta ratio (BR) of the 6T SRAM cell, where the BR is the ratio of the conductivity (impedance (Z) divided by the length (L)) of the pull-down transistor (PD) to the conductivity of the pass-gate transistor (PG), such that $BR=(Z_{PD}/L_{PD})/(Z_{PG}/L_{PG})$. In 6T SRAM cells made from planar transistors, stability may be achieved through appropriate transistor sizing of the PG relative to the PD to obtain a beta ratio to provide sufficient SNM (geometrically defined SNM).

Non-planar (e.g., tri-gate) transistors have different device physics than planar transistors. For example, increasing the Z of a non-planar transistor may significantly degrade performance and short channel effects of the device. Accordingly, 6T SRAM cells made from non-planar transistors require the PG and PD to have substantially the same Z ($Z_{PD}=Z_{PG}$).

Furthermore, as technology continues to be scaled to smaller and smaller sizes the scaled gate length and gate pitch required for future generation SRAM cells may have significant lithographic restrictions imposed and require uniform patterning. This may result in SRAM cells with identical gate lengths for the pass and pull-down transistors ($L_{PD}=L_{PG}$).

BRIEF DESCRIPTION OF THE DRAWINGS

The features and advantages of the various embodiments will become apparent from the following detailed description in which.

DETAILED DESCRIPTION

Figure 1:
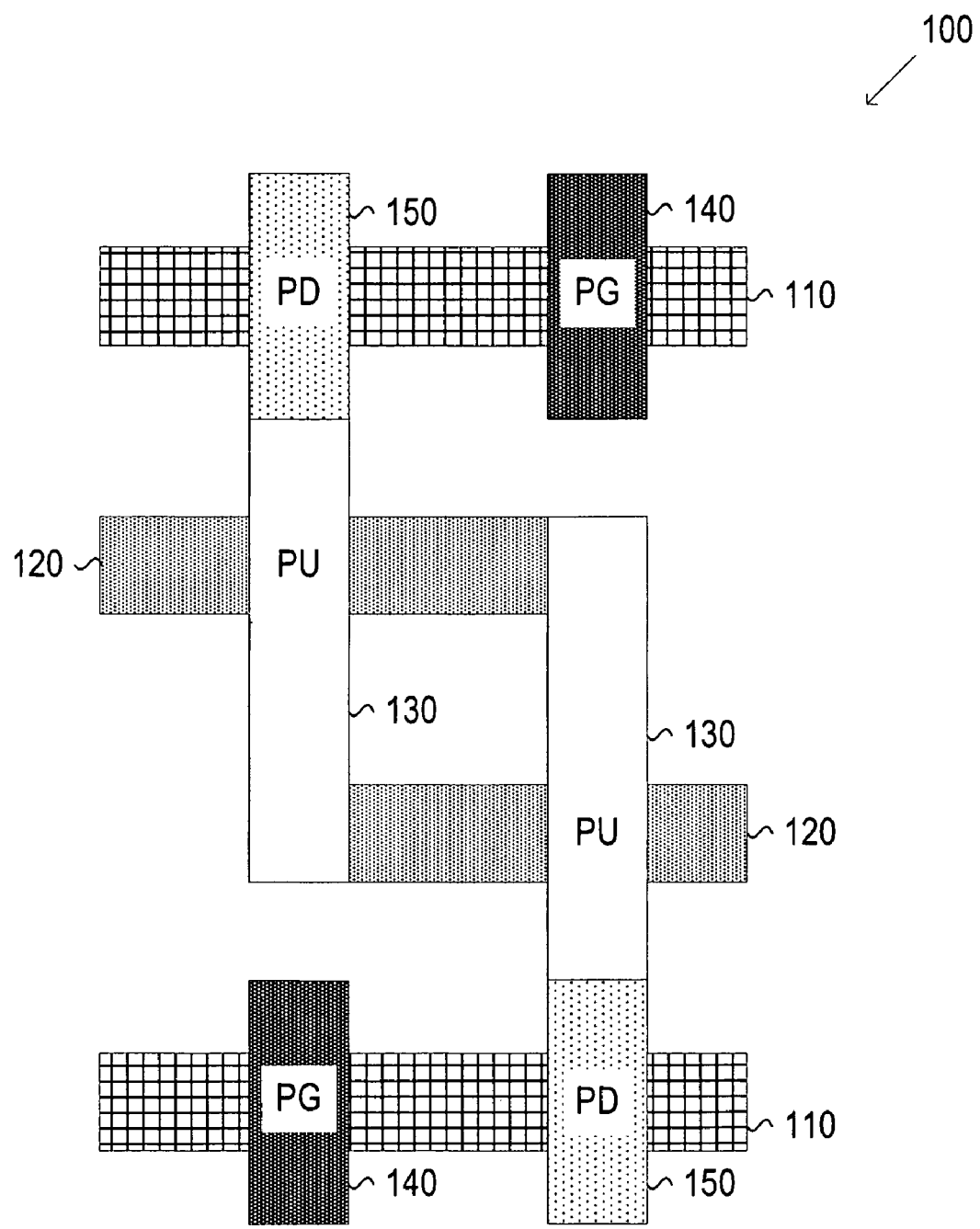
FIG. 1 illustrates a layout of an example non-planar (tri-gate) 6T SRAM cell, according to one embodiment.

FIG. 1 illustrates a layout of an example non-planar (tri-gate) 6T SRAM cell 100. The cell 100 includes N-diffusion regions (fins) 110, P-diffusion regions (fins) 120, pull-up (PU) gate electrode stacks 130, pass-gate (PG) gate electrode stacks 140 and pull-down (PD) gate electrode stacks 150. The gate electrode stacks 130, 140, 150 wrap around the sides and top of the respective fins 110, 120 to form two tri-gate PU transistors, two tri-gate PD transistors and two tri-gate PG transistors. As illustrated, the physical parameters (length and impedance) of the PGs and the PDs are the same ($L_{PD}=L_{PG}$, $Z_{PD}=Z_{PG}$) so that the cell 100 has a unity beta ratio (BR=1). Utilizing different materials for the PG gate electrode stack 140 and the PD gate electrode stack 150 enables modification of the static noise margin (SNM) to maintain cell stability during read operations for the unity beta ratio cell 100 based on the difference in the threshold voltages ($V_t$) of the gate electrode stacks 140, 150.

Figure 2:
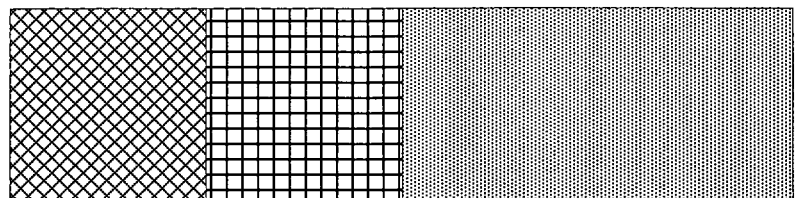
FIG. 2 illustrates an example substrate in which a P-diffusion fin, an N-diffusion PD fin, and an N-diffusion PG fin are formed, according to one embodiment.

FIGS. 2-7 illustrate the process for forming the 6T SRAM cell 100 having different gate electrode stacks for the PG and PD. FIG. 2 illustrates an example substrate in which a P-diffusion fin 210, an N-diffusion PD fin 220, and an N-diffusion PG fin 230 are formed. The fins 210, 220, 230 extend about the semiconductor substrate so that tri-gate transistors may be formed but are illustrated as being planar simply for ease of illustration. The fins 210, 220, 230 may be formed through any number of known processes.

Figure 3:
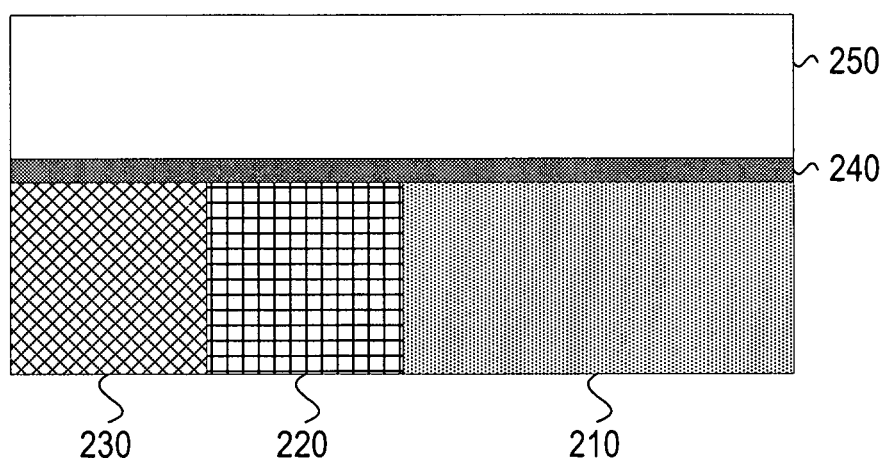
FIG. 3 illustrates the example substrate after a gate dielectric layer is formed on the substrate and an initial P-diffusion conductive layer is formed on the insulating layer, according to one embodiment.

FIG. 3 illustrates the example substrate after a gate dielectric layer (e.g., oxide, nitride, high dielectric constant (K) material) 240 is formed on the substrate and an initial P-diffusion gate electrode conductive layer (e.g., metal, polysilicon) 250 is formed on the gate dielectric layer 240. The formation of the gate dielectric layer 240 and the initial P-diffusion conductive layer 250 may be performed through any number of known processes.

Figure 4:
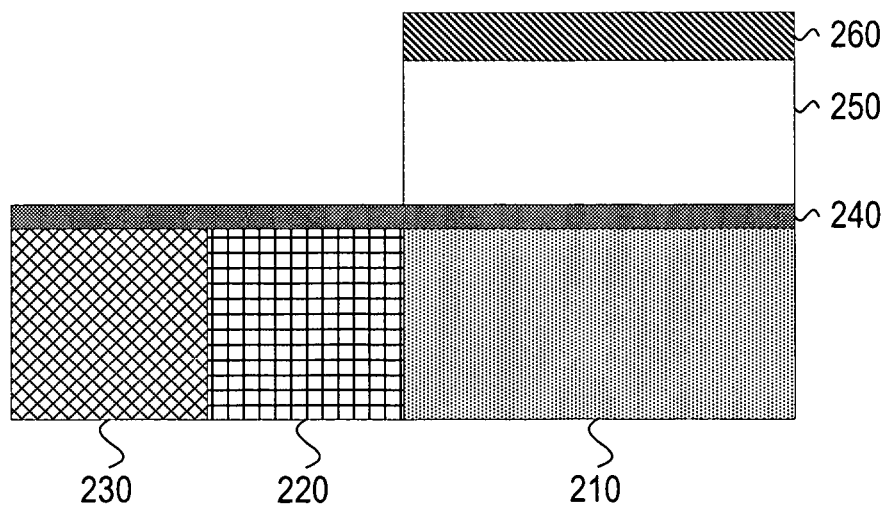
FIG. 4 illustrates the example substrate after a hard mask is formed and patterned to cover the P-diffusion fin, and the initial P-diffusion conductive layer is etched from the N-diffusion PD fin and the N-diffusion PG fin, according to one embodiment.

FIG. 4 illustrates the example substrate after a hard mask 260 is formed over the initial P-diffusion conductive layer 250, is patterned to cover the P-diffusion fin 210, and the initial P-diffusion conductive layer 250 is etched from the N-diffusion PD fin 220 and the N-diffusion PG fin 230. The formation and patterning of the hard mask 260 and the etching of the initial P-diffusion conductive layer 250 may be performed through any number of known processes.

Figure 5:
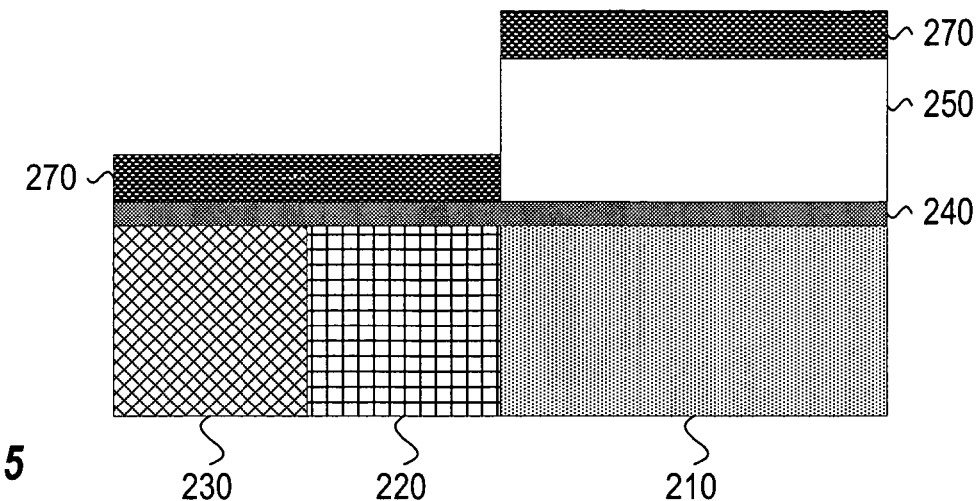
FIG. 5 illustrates the example substrate after the hard mask is removed and an initial PG conductive layer is formed over the substrate, according to one embodiment.

FIG. 5 illustrates the example substrate after the hard mask 260 is removed and an initial PG gate electrode conductive layer (e.g., metal, polysilicon) 270 is formed over the substrate (the initial P-diffusion conductive layer 250, and the gate dielectric layer 240 over the N-diffusion PD fin 220 and the N-diffusion PG fin 230). The removal of the hard mask 260 and the formation of the initial PG conductive layer 270 may be performed through any number of known processes.

Figure 6:
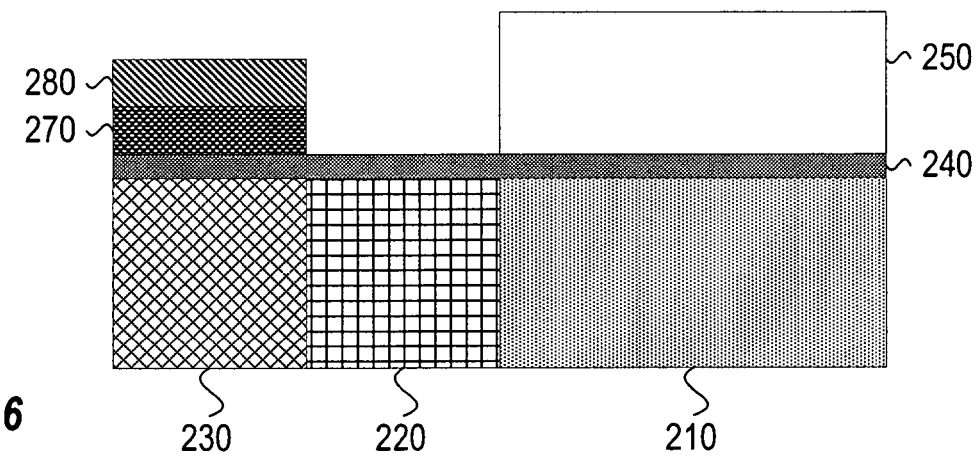
FIG. 6 illustrates the example substrate after a hard mask is formed and patterned to cover the PG fin, and the initial PG conductive layer is etched from the N-diffusion PD fin and the initial P-diffusion conductive layer, according to one embodiment.

FIG. 6 illustrates the example substrate after a hard mask 280 is formed and patterned to cover the PG fin 230, and the initial PG conductive layer 270 is etched from the N-diffusion PD fin 220 and the initial P-diffusion conductive layer 250 on the P-diffusion fin 210. The formation and patterning of the hard mask 280 and the etching of the initial PG conductive layer 270 may be performed through any number of known processes.

Figure 7:
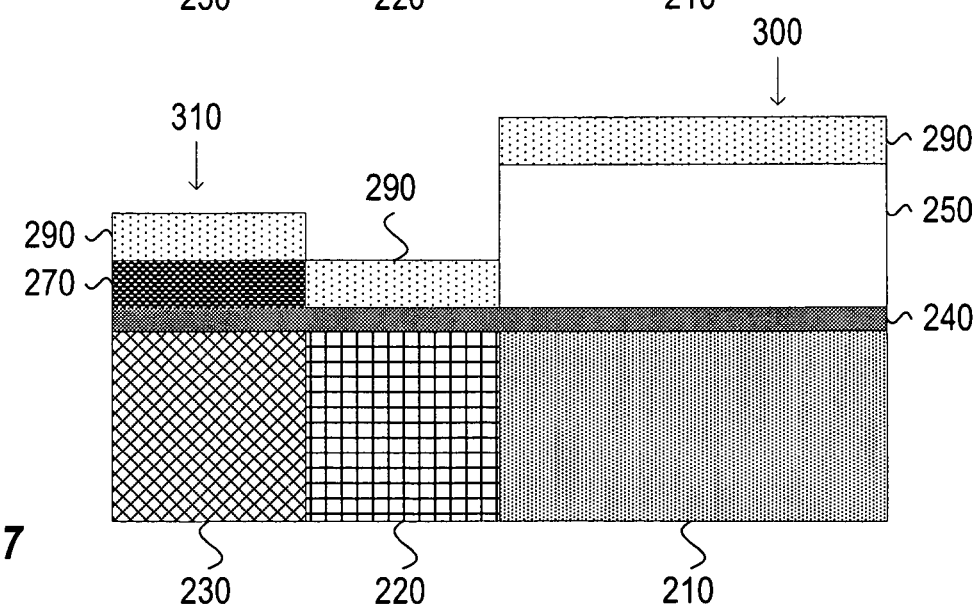
FIG. 7 illustrates the example substrate after the hard mask is removed and a PD conductive layer is formed over the substrate, according to one embodiment.

FIG. 7 illustrates the example substrate after the hard mask 280 is removed and a PD gate electrode conductive layer (e.g., metal, polysilicon) 290 is formed over the substrate (the initial P-diffusion conductive layer 250, the initial PG conductive layer 270 and the gate dielectric layer 240 over the N-diffusion PD fin 220). The removal of the hard mask 280 and the formation of the PD conductive layer 290 may be performed through any number of known processes.

The overall PU gate electrode stack 300 over the P-diffusion fin 210 now consists of the initial P-diffusion conductive layer 250 and the PD conductive layer 290. The overall PG gate electrode stack 310 over the N-diffusion PG fin 230 now consists of the initial PG conductive layer 270 and the PD conductive layer 290. The gate electrode stack over the N-diffusion PD fin 220 is the PD conductive layer 290.

A hard mask may be formed over the entire substrate and then patterned to form a gate electrode hard mask (not illustrated) that is used to pattern the gate electrodes 130, 140, 150 of FIG. 1. The resultant 6T SRAM cell 100 of FIG. 1 has different gate electrode stacks 290, 300, 310 for each of the tri-gate transistor types. The selection of the material and the depth of each of the gate electrode stack layers 250, 270, 290 may be selected to provide the overall desired gate electrode thickness and $V_t$ for each of the gate electrode stacks 290, 300, 310. The difference in the $V_t$ of the PG gate electrode stack 310 and the PD gate electrode stack 290 is used to control the SNM of the cell 100.

Although the disclosure has been illustrated by reference to specific embodiments, it will be apparent that the disclosure is not limited thereto as various changes and modifications may be made thereto without departing from the scope. Reference to "one embodiment" or "an embodiment" means that a particular feature, structure or characteristic described therein is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

What is claimed is:

1. A method comprising
   forming N-diffusion and P-diffusion fins in a semiconductor substrate;
   forming a P-diffusion gate layer over the semiconductor substrate;
   removing the P-diffusion gate layer from the N-diffusion fins;
   forming a pass-gate N-diffusion gate layer over the semiconductor substrate;
   removing the pass-gate N-diffusion gate layer from the P-diffusion fins and a pull-down portion of the N-diffusion fins; and
   forming a pull-down N-diffusion gate layer over the semiconductor substrate, wherein
   a P-diffusion gate electrode stack includes the P-diffusion gate layer and the pull-down N-diffusion gate layer;
   a pass-gate gate electrode stack includes the pass-gate N-diffusion gate layer and the pull-down N-diffusion gate layer; and
   a pull-down gate electrode stack includes the pull-down N-diffusion gate layer, wherein threshold voltage of the pass-gate gate electrode stack and threshold voltage of the pull-down gate electrode stack are different.

2. The method of claim 1, wherein the pass-gate gate electrode stack and the pull-down gate electrode stack having substantially same impedance.

3. The method of claim 1, further comprising forming a dielectric layer on the semiconductor substrate, wherein the forming a P-diffusion gate layer includes forming the P-diffusion gate layer over the dielectric layer.

4. The method of claim 1, further comprising
   forming a gate electrode hard mask over the semiconductor substrate; and
   etching the P-diffusion gate electrode stack, the pass-gate gate electrode stack, and the pull-down gate electrode stack using the gate electrode hard mask to form P-diffusion gate electrodes, pass-gate gate electrodes, and pull-down gate electrodes.

5. The method of claim 4, wherein the forming a gate electrode hard mask includes
   forming a hard mask layer over the semiconductor substrate;
   patterning a resist layer over the hard mask layer; and
   etching the hard mask layer.

6. The method of claim 5, wherein
   the patterning includes uniform lithographic patterning, and
   the etching results in the gate electrode hard mask having uniform patterns for the P-diffusion gate electrodes, the pass-gate gate electrodes, and the pull-down gate electrodes.

7. The method of claim 4, wherein the forming a gate electrode hard mask includes forming the gate electrode hard mask to create gate electrodes for a six transistor static random access memory (6T SRAM) cell.

8. The method of claim 7, wherein the etching includes etching the P-diffusion gate electrode stack, the pass-gate gate electrode stack, and the pull-down gate electrode stack to create the 6T SRAM cell.

9. The method of claim 8, wherein the 6T SRAM cell includes non-planar transistors.

10. The method of claim 1, further comprising selecting thicknesses of the P-diffusion gate layer, the pass-gate N-diffusion gate layer, and the pull-down N-diffusion gate layer so the P-diffusion gate electrode stack, the pass-gate gate electrode stack, and the pull-down gate electrode stack result in desired thickness.

11. The method of claim 1, further comprising selecting the pass-gate N-diffusion gate layer material and the pull-down N-diffusion gate layer material to provide desired threshold voltage difference between the pass-gate gate electrode stack and the pull-down gate electrode stack.

12. A method comprising
    forming a semiconductor substrate having N-diffusion fins and P-diffusion fins;
    forming a dielectric layer on the semiconductor substrate;
    forming a P-diffusion gate layer over the semiconductor substrate;
    removing the P-diffusion gate layer from the N-diffusion fins;
    forming a first N-diffusion gate layer over the semiconductor substrate;
    removing the first N-diffusion gate layer from the P-diffusion fins and a portion of the N-diffusion fins;
    forming a second N-diffusion gate layer over the semiconductor substrate;
    forming a six transistor static random access memory (6T SRAM) cell gate electrode hard mask over the semiconductor substrate; and
    etching a pull-up gate electrode stack formed over the P-diffusion fins, a pass-gate gate electrode stack formed over a first portion of the N-diffusion fins, and a pull-down gate electrode stack formed over a second portion of the N-diffusion fins using the 6T SRAM cell gate electrode hard mask to form pull-up gate electrodes, pass-gate gate electrodes, and pull-down gate electrodes, wherein the pull-up gate electrodes include the P-diffusion gate layer and the second N-diffusion gate layer, the pass-gate gate electrodes include the first N-diffusion gate layer and the second N-diffusion gate layer, and the pull-down gate electrodes include the second N-diffusion gate layer, wherein threshold voltage of the pass-gate gate electrodes and threshold voltage of the pull-down gate electrodes are different.

13. The method of claim 12, wherein the pass-gate gate electrodes and the pull-down gate electrodes have substantially same impedance.

14. The method of claim 12, wherein the pull-up gate electrodes, the pass-gate gate electrodes and the pull-down gate electrodes have substantially uniform patterns.

15. The method of claim 12, wherein the forming a 6T SRAM cell gate electrode hard mask includes
   forming a hard mask layer over the semiconductor substrate;
   patterning a resist layer over the hard mask layer; and
   etching the hard mask layer.

16. The method of claim 12, further comprising selecting thicknesses of the P-diffusion gate layer, the first N-diffusion gate layer, and the second N-diffusion gate layer to provide desired thicknesses of the pull-up gate electrodes, the pass-gate gate electrodes, and the pull-down gate electrodes.

17. The method of claim 12, further comprising selecting the first N-diffusion gate layer material and the second N-diffusion gate layer material to provide desired threshold voltage difference between the pass-gate gate electrodes and the pull-down gate electrodes.

* * * * *